United States Patent
Shimizu et al.

(10) Patent No.: US 6,343,978 B1
(45) Date of Patent: Feb. 5, 2002

(54) METHOD AND APPARATUS FOR POLISHING WORKPIECE

(75) Inventors: Noburu Shimizu; Norio Kimura, both of Kanagawa-ken (JP)

(73) Assignee: Ebara Corporation, Tokyo (JP)

(*) Notice: Subject to any disclaimer, the term of this patent is extended or adjusted under 35 U.S.C. 154(b) by 0 days.

(21) Appl. No.: 09/566,624

(22) Filed: May 8, 2000

Related U.S. Application Data

(60) Division of application No. 09/301,718, filed on Apr. 29, 1999, which is a continuation-in-part of application No. 08/857,252, filed on May 16, 1997, now Pat. No. 5,989,107, which is a continuation-in-part of application No. 08/972,012, filed on Nov. 17, 1997, now abandoned, which is a continuation-in-part of application No. PCT/JP98/05253, filed on Nov. 20, 1998.

(51) Int. Cl.[7] ................................................. B24B 1/00
(52) U.S. Cl. ............................ 451/57; 451/63; 451/287
(58) Field of Search .............................. 451/41, 67, 57, 451/287, 288, 289, 334, 388, 389, 63

(56) References Cited

U.S. PATENT DOCUMENTS

| | | |
|---|---|---|
| 3,659,386 A | 5/1972 | Goetz et al. |
| 3,906,678 A | 9/1975 | Roth |
| 3,913,271 A | 10/1975 | Boettcher et al. |
| 4,680,893 A * | 7/1987 | Cronkhite et al. ............ 451/57 |
| 5,232,875 A | 8/1993 | Tuttle et al. |
| 5,551,986 A | 9/1996 | Jain |
| 5,554,064 A | 9/1996 | Breivogel et al. ............ 451/41 |
| 5,618,227 A | 4/1997 | Tsutsumi et al. ............. 451/66 |
| 5,649,854 A | 7/1997 | Gill, Jr. ......................... 451/66 |
| 5,655,954 A * | 8/1997 | Oishi et al. .................. 451/287 |
| 5,658,190 A * | 8/1997 | Wright et al. ................ 451/285 |
| 5,676,590 A * | 10/1997 | Hiraoka ........................ 451/287 |
| 5,718,618 A | 2/1998 | Guckel et al. |
| 5,792,709 A * | 8/1998 | Robinson et al. .............. 451/9 |
| 5,830,045 A | 11/1998 | Togawa et al. |
| 5,885,138 A | 3/1999 | Okumura et al. |
| 5,897,426 A | 4/1999 | Somekh |
| 5,908,530 A * | 6/1999 | Hohizaki et al. ............ 156/345 |
| 5,924,917 A * | 7/1999 | Benedict et al. ............ 451/539 |
| 6,110,013 A * | 8/2000 | Minami et al. ................ 451/65 |

FOREIGN PATENT DOCUMENTS

| | | |
|---|---|---|
| DE | 197634 | 4/1908 |
| EP | 0 517 594 | 12/1992 |
| EP | 0 684 634 | 11/1995 |
| EP | 0 807 492 | 11/1997 |
| JP | 2-208931 | 8/1990 |
| JP | 4-69147 | 3/1992 |
| JP | 5-74749 | 3/1993 |
| JP | 5-285807 | 11/1993 |
| JP | 7-135192 | 5/1995 |
| JP | 8-64562 | 3/1996 |
| JP | 9-232257 | 9/1997 |
| JP | 10-256201 | 9/1998 |
| WO | 82/03038 | 9/1982 |
| WO | 96/36459 | 11/1996 |

OTHER PUBLICATIONS

Kaitoh Tei et al., "Planarization of Device Wafer with Fixed Abrasive Particles (Second Report)"—Planarization Working Characteristics with Fine Silica Grindstone—, from the Japan Society for Precision Engineering.

* cited by examiner

Primary Examiner—Derris H. Banks
(74) Attorney, Agent, or Firm—Wenderoth, Lind & Ponack, L.L.P.

(57) ABSTRACT

A workpiece such as a semiconductor wafer is polished by pressing the workpiece against a polishing surface under a predetermined pressure. A polished surface of the workpiece is processed by pressing the workpiece against a processing surface under a predetermined pressure while the processing surface makes circulatory translational motion along a predetermined path. The processing surface comprises a surface of a polishing cloth or a surface of an abrading plate, and the polished surface of the workpiece is further polished or cleaned.

67 Claims, 10 Drawing Sheets

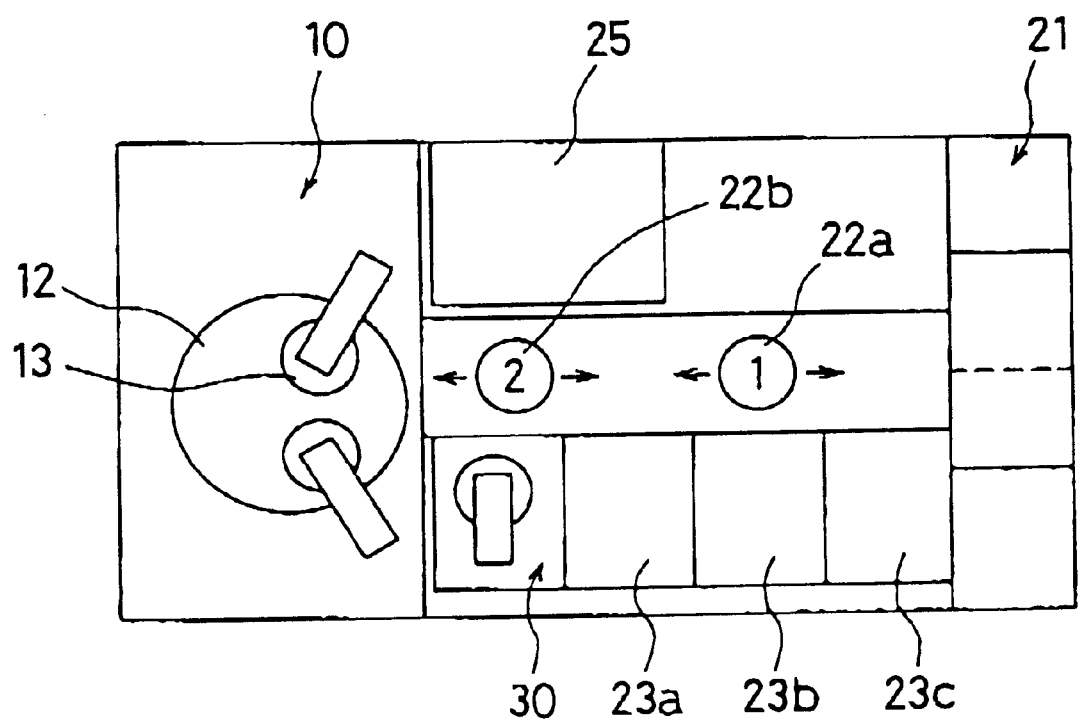
F I G. 1

F I G. 5
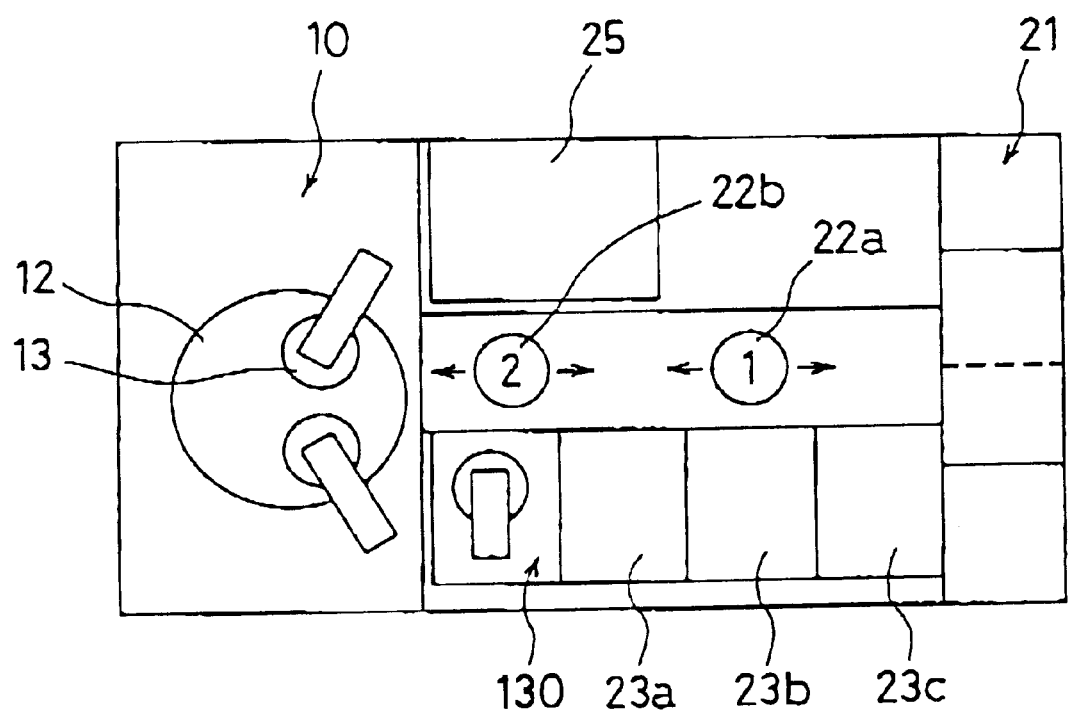

METHOD AND APPARATUS FOR POLISHING WORKPIECE

This is a divisional application Ser. No. 09/301,718, filed Apr. 29, 1999, which is a continuation-in-part of application Ser. No. 08/857,252, filed May 16, 1997, now U.S. Pat. No. 5,989,107 of application Ser. No. 08/972,012, filed Nov. 17, 1997, now abandoned and of International Application No. PCT/JP98/05253, filed Nov. 20, 1998.

BACKGROUND OF THE INVENTION

1. Field of the Invention

The present invention relates to a method and an apparatus for polishing a workpiece, and more particularly to a method and an apparatus for polishing a workpiece such as a semiconductor wafer, a glass substrate, or a liquid crystal panel which is required to be highly cleaned.

2. Description of the Related Art

As semiconductor devices become more highly integrated, circuit interconnections become finer and the distances between those interconnections also become smaller. Photolithographic processes for producing interconnections that are 0.5 $\mu$m wide or smaller, particularly, require a flat image-focusing plane for the stepper because the depth between focal points is small. If a dust particle whose size is greater than the distances between the interconnections is present on a semiconductor substrate, then an undesirable short circuit tends to occur between interconnections through the dust particle.

Therefore, it is important that the workpiece processing must produce a flat and clean workpiece. These processing requirements apply equally to other workpiece materials, such as glass substrates for photo-masking or liquid crystal display panels.

One conventional polishing apparatus is shown in FIG. 9 of the accompanying drawings. As shown in FIG. 9, the conventional polishing apparatus includes a polishing unit 10, a loading/unloading unit 21, a feed robot 22, and two cleaning machines 23a, 23b. As shown in FIG. 10 of the accompanying drawings, the polishing unit 10 comprises a turntable 12 with a polishing cloth 11 attached to an upper surface thereof, and a top ring 13 for holding a workpiece 1 such as a semiconductor wafer and pressing the workpiece 1 against the polishing cloth 11 on the turntable 12.

In operation, the workpiece 1 is supported on the lower surface of the top ring 13, and pressed by a lifting/lowering cylinder against the polishing cloth 11 on the turntable 12 which is being rotated. A polishing solution (abrasive solution) Q is supplied from a polishing solution nozzle 14 onto the polishing cloth 11 and retained by the polishing cloth 11. The lower surface of the workpiece 1 is polished by the polishing cloth 11 while the polishing solution Q is being present between the workpiece 1 and the polishing cloth 11.

The turntable 12 and the top ring 13 rotate at respective speeds that are independent of each other. The top ring 13 holds the workpiece 1 with its edges being spaced distances "a", "b" from the center and the circumferential edge of the turntable 12. Thus, the entire lower surface of the workpiece 1 is uniformly polished at a high polishing rate. The workpiece 1 has a diameter "d". The turntable 12 has a diameter "D" which is selected to be at least twice the diameter "d" of the workpiece 1, as indicated by the following equation:

$$D=2(d+a+b)$$

After having been polished, the workpiece 1 is cleaned in one or more cleaning processes and dried by the cleaning machines 23a, 23b, and then housed in a delivery cassette 24 of the loading/unloading unit 21. when the workpiece 1 is cleaned, it may be scrubbed by a brush of nylon, mohair or the like, or a sponge of PVA (polyvinyl alcohol).

In the conventional polishing apparatus, since the relative displacement between the turntable 12 and the top ring 13 is large, and the relative sliding speed between them is also large, the workpiece 1 can be polished efficiently to a flat finish. However, the polished surface of the workpiece 1 tends to have a large surface roughness.

In order to produce a polished workpiece of better surface quality, consideration may be given to using two turntables which are operated by varying the surface roughnesses of the polishing cloths, rotational speeds and types of polishing solutions. However, as mentioned above, the diameter of the turntable is larger than twice that of the workpiece diameter, and each apparatus takes up a large floor space area which leads to higher facility costs. These problems becomes less ignorable as the semiconductor manufacturing industry seeks larger diameter substrates.

While it is possible to use one turntable to produce a superior surface quality by varying the type of polishing solution and lowering the rotational speed of the turntable, it is obvious that such an approach leads not only to a potential increase in the cost of polishing solution but also to inevitable lowering in the production efficiency due to a prolonged polishing operation.

In order to make the workpiece clean, there are some cases where scrubbing process are carried out after the workpiece 1 has been polished using the polishing solution Q. However, such scrubbing process fails to remove sub-micron particles from the polished surface of the workpiece 1, and is not effective enough to clean the polished workpiece 1 if remaining particles are bonded to the workpiece 1 by large bonding strength.

Further, the conventional polishing apparatus of the type described above has an advantage in that the entire surface of the workpiece is polished uniformly, because the elasticity of the polishing cloth 11 moderates the effects of undulation and bowing in the workpiece. However, a workpiece such as a semiconductor wafer is susceptible to edge wear caused by excessive polishing around the peripheral edge of the wafer. Further, in order to polish semiconductor wafers with printed wiring patterns, it is required to obtain a polished surface having a flatness of less than 1,000 angstroms by removing any micro-protrusions from uneven surfaces of the semiconductor wafer. However, the polishing cloth 11 is unable to meet this requirement because the elasticity of the polishing cloth allows the cloth itself to deform, and the material from recessed regions as well as from protruding regions is removed.

SUMMARY OF THE INVENTION

It is therefore an object of the present invention to provide a method and an apparatus for polishing a workpiece such as a semiconductor wafer to a smooth flat finish with improved surface roughness, while effectively removing minute particles from the polished surface.

Another object of the present invention is to provide a compact polishing apparatus to produce a high degree of flatness of a workpiece such as a semiconductor wafer.

According to one aspect of the present invention, there is provided a method for polishing a workpiece, comprising polishing a surface of the workpiece by pressing the workpiece against a polishing surface and processing a polished surface of the workpiece by pressing the workpiece against a processing surface. The processing surface makes relative translational motion relative to the workpiece.

According to another aspect of the present invention, there is also provided an apparatus for polishing a workpiece comprising a polishing unit for polishing a surface of the workpiece by pressing the surface of the workpiece against a polishing surface and a processing unit for processing a polished surface of the workpiece by pressing the workpiece against a processing surface. The processing surface makes relative translational motion relative to the workpiece. respective rotational motion. However, it may include a respective rotation of a relatively large period of rotation compared to that of the circulative translation between the two surfaces. The trace of translation motion can be a linear translation pattern, a polygonal pattern or an elliptical pattern, but from the practical standpoint of polishing or processing efficiency and mechanical ease, a circular pattern would be optimum. In the circulative translation motion, all the regions of the workpiece are subjected to the same pattern.

In the present invention, a high removal ratio and a high flatness of the workpiece such as a semiconductor wafer is obtained in the polishing step by subjecting the workpiece to a high speed material removal process with the polishing surface. In the processing step, the surface processing is carried out by a processing surface at a slow relative speed to attain a smooth surface of the workpiece, and also any micro-particles which may be adhered to the workpiece are removed. The surface of the workpiece is treated with a solution appropriate to the application. That is, in case the processing step comprises a polishing step, abrasive particles are used while purified water or a suitable chemical solution is used in the processing step. In the processing step, abrasive particles are normally not used, and if they are used, a small amount of ultra-fine particles are used, and the pressing pressure of the workpiece against the processing surface is reduced compared to the polishing step.

Generally, a polishing apparatus of the circulatory translational motion type may have a processing surface such as a polishing cloth which is of relatively small dimensions. Then, the relative speed between the surface being polished of a workpiece and a polishing cloth is so small that sufficient polishing speed cannot be achieved for polishing the workpiece. According to the present invention, the processing surface which makes circulatory translational motion can be used because no large processing speed is required by the processing unit such as a cleaning unit.

In case a surface of an abrading plate is used as a polishing surface or a processing surface, such an apparatus can satisfy a wide range of polishing needs, from rough grinding to finish polishing, by choosing an abrasive grain size, a method of supplying the polishing solution and a rotational seed to suit each work. That is, to perform rough polishing, the abrading surface is made coarser and a relatively high speed and high pressing pressure are used. On the other hand, to perform finish polishing, the abrading surface is made finer and a relatively low speed and low pressing pressure are applied. Removal of micro-particles adhering to the workpiece surface may also be performed during the finish polishing by using a solution appropriate to the purpose. Specifically, for rough polishing, abrasive grains are used while for finish polishing, deionized water and solutions may be used. Abrading grains are normally not used in finish polishing, but if they are needed, a small amount of ultra-fine micro-grains is used.

The circulatory translational motion is defined as "a relative motion-between a first surface and a second surface facing the first surface and a non-rotational motion which causes every point on the first surface to describe a substantially identical locus with respect to the second surface." The locus maybe a circle, an ellipse, a polygon, or any other regular shape. For a better polishing ability and mechanical reasons, the circulatory translational motion should preferably be made along a circular path. The circulatory translational motion along the circular path allows the on fronting surfaces to move relative to each other uniformly in different areas thereof.

The circulatory translational motion of this invention has the same meaning as orbital motion.

In preferred aspects, the polishing surface may comprise a surface of a polishing cloth or a surface of an abrading plate. The polishing surface may rotate about its rotating axis or make relative translational motion relative to the workpiece. The translational motion of the polishing surface may be provided only by moving the polishing surface.

The processing may comprise polishing of the polished surface of the workpiece or cleaning of the polished surface of the workpiece. The processing surface may comprise a surface of a polishing cloth or a surface of a wiping cloth or a surface of an abrading plate. The relative translational motion of the processing surface maybe provided only by moving the processing surface is more uniformly polished.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 1 is a plan view of a polishing apparatus according to a first embodiment of the present invention;

FIG. 5 is a plan view of a polishing apparatus according to a second embodiment of the present invention;

DESCRIPTION OF THE PREFERRED EMBODIMENTS

Figure 2:
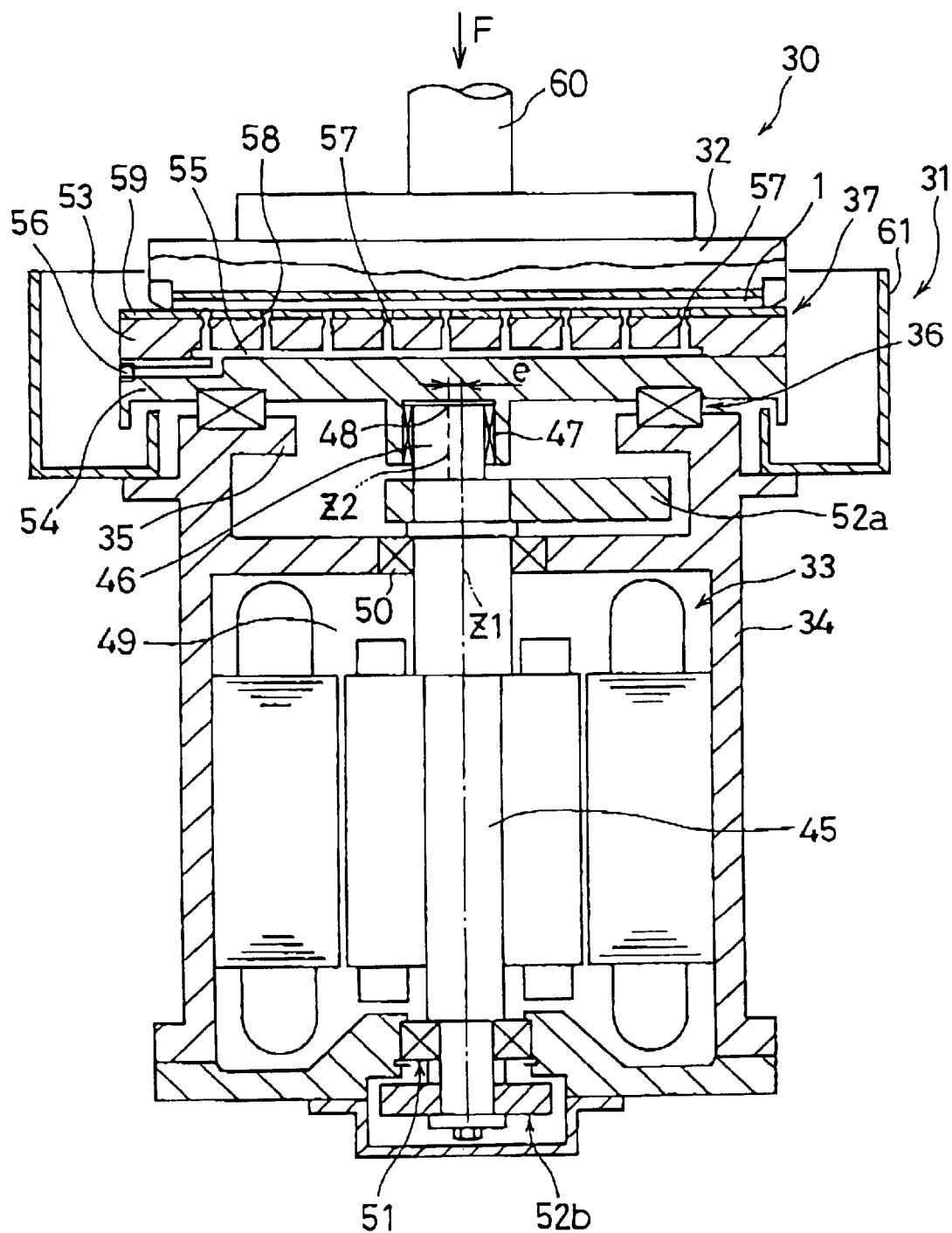
FIG. 2 is a vertical cross-sectional view of a finish polishing unit of the polishing apparatus shown in FIG. 1.

Next, a polishing apparatus according to a first embodiment of the present invention will be described with reference to FIGS. 1 through 3A and 3B.

As shown in FIG. 1, a polishing apparatus has a loading/unloading unit 21 positioned at an end of an elongate rectangular space for loading and unloading workpieces 1

(see FIG. 2) such as semiconductor wafers, and a main polishing unit 10 positioned at an opposite end of the elongate rectangular space for polishing the workpieces 1. The loading/unloading unit 21 and the main polishing unit 10 are interconnected by a workpiece delivery line along which two feed robots 22a, 22b are movable between the loading/unloading unit 21 and the main polishing unit 10. The polishing apparatus also includes a reversing machine 25 disposed on one side of the workpiece delivery line for reversing the workpieces 1, a finish polishing unit (second polishing section) 30 and three cleaning units 23a, 23b, 23c disposed on the other side of the workpiece delivery line. The cleaning units 23a, 23b, and 23c include rinsing machines or scrubbing machines using brushes, sponges or the like.

The main polishing unit 10 comprises a turntable 12 and two top rings 13, and is capable of parallel processing of two workpieces simultaneously. Except for the two top rings 13, the main polishing unit 10 is basically the same as the polishing unit 10 shown in FIGS. 9 and 10.

The finish polishing unit 30 will be described below with reference to FIGS. 2 through 3A and 3B.

The finish polishing unit 30 comprises a translational table section 31 which provides an abrading surface that makes circulatory translational motion, and a top ring 32 for holding a workpiece 1 with its lower surface facing downwardly and pressing the workpiece 1 against the abrading surface with a given pressure.

Figure 3A:
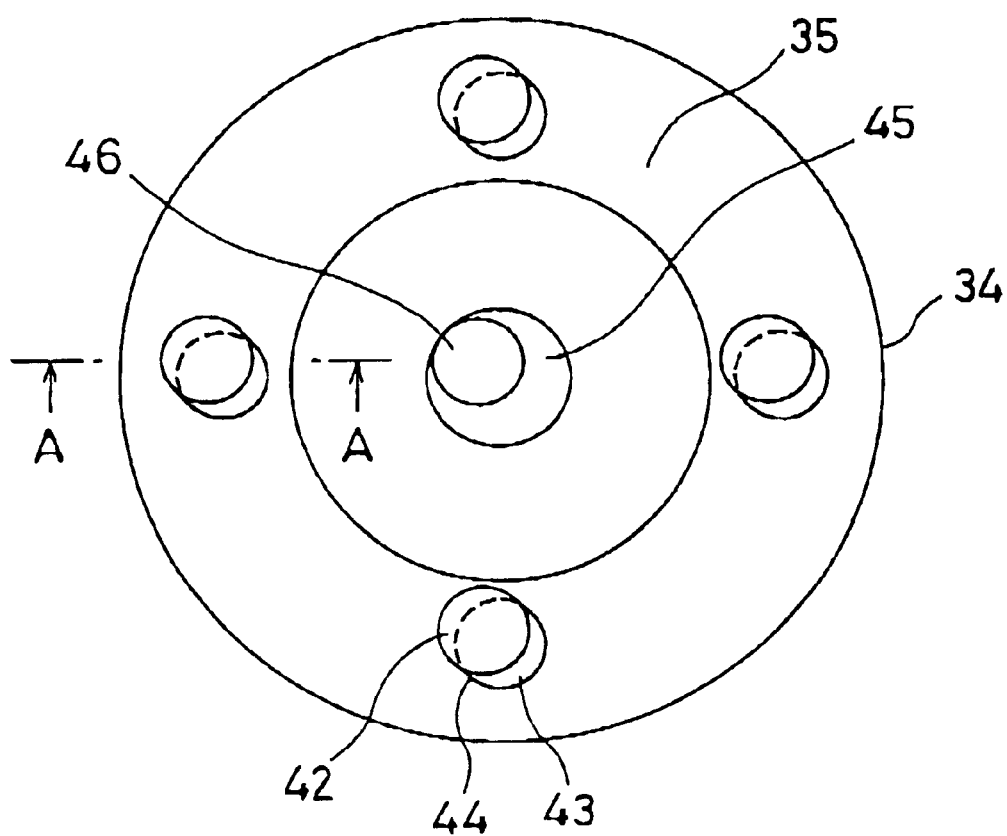
FIG. 3A is an enlarged plan view of a support structure on a casing for supporting the edge of a surface plate of the finish polishing unit shown in FIG. 2.
Figure 3B:
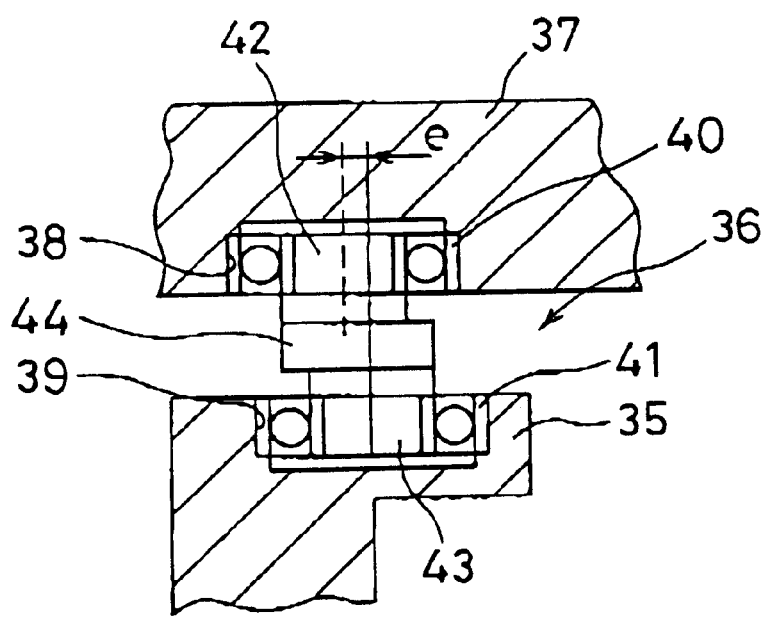
FIG. 3B is a fragmentary cross-sectional view taken along line A—A of FIG. 3A.

The translational table section 31 comprises a vertical cylindrical casing 34 housing an electric motor 33 therein and having an annular support flange 35 extending radially inwardly from an upper peripheral edge of the casing 34. The support flange 35 has on its upper surface three or more circumferentially spaced support structures 36 which carry a surface plate 37 thereon. Specifically, as shown in FIG. 3B, the surface plate 37 has a plurality of circumferentially equally spaced cavities 38 defined in its lower surface, and the support flange 35 has a plurality of circumferentially equally spaced cavities 39 defined in its upper surface. The cavities 38 and the cavities 39 are slightly horizontally displaced from each other for reasons described below. The support structures 36 comprise respective upper bearings 40 disposed in the respective cavities 38 and respective lower bearings 41 disposed in the respective cavities 39 The upper and lower bearings 40, 41 of each of the support structures 36 are axially interconnected by a cranked joint 44 having upper and lower shafts 42, 43 that are fitted respectively in the upper and lower bearings 40, 41. The shafts 42, 43 and hence the upper and lower bearings 40, 41 have respective axes horizontally spaced from each other by a distance "e". The surface plate 37 is coupled to the motor 33 as described below. When the motor 33 is energized, the surface plate 37 that is coupled to the motor 33 and supported by the support structures 36 can make translational motion along circles each having a radius which is the same as the distance "e".

The surface plate 37 has a tubular member projecting downwardly from the lower surface thereof and defining a recess 48 therein. The motor 33 has a vertical shaft 45 having an upper end connected to an eccentric drive shaft 46 that is rotatably mounted in the recess 48 by a bearing 47. The eccentric drive shaft 46 has its central axis Z2 spaced horizontally from a central axis Z1 of the shaft 45 by a distance "e". The motor 33 is disposed in a motor chamber 49 that is defined in the casing 34, and the shaft 45 is rotatably supported in the casing 34 by upper and lower bearings 50, 51. Balancers 52a, 52b are attached respectively to upper and lower ends of the shaft 45 for keeping the shaft 45 in a balanced state while the shaft 45 is rotated in unison with the eccentric drive shaft 46.

The surface plate 37 has a diameter which is slightly larger than the sum of the diameter of the workpiece 1 to be polished and the distance "e". The surface plate 37 comprises two plate members 53, 54 joined to each other with a space 55 defined therebetween for allowing a polishing solution (abrasive liquid) to be supplied to a polishing surface to pass therethrough. The space 55 is held in communication with a supply port 56 defined in a side surface of the surface plate 37 and also with a plurality of discharge ports 57 defined in the upper plate member 53 and opening upwardly. A polishing cloth 59 is attached to the upper surface of the surface plate 37, and has a plurality of discharge holes 58 defined therein and aligned in registry with the respective discharge ports 57. The upper surface of the polishing cloth 59 constitutes a polishing surface. Usually, the discharge ports 57 and the discharge holes 58 are disposed substantially uniformly over the entire surface of the surface plate 37. The polishing cloth 59 may have a grid-like, spiral, or radial pattern of fluid flow grooves defined in the upper surface thereof, and the discharge holes 58 may be held in communication with those grooves.

The top ring 32 is mounted on the lower end of a shaft 60 so as to allow the top ring 32 to tilt upon changes in the inclination of the polishing surface of the polishing cloth 59. Downward pressing forces applied by an air cylinder (not shown) and rotative forces from a drive motor (not shown) are transmitted through the shaft 60 to the top ring 32. The top ring 32 is structurally identical to the top ring 13 shown in FIGS. 9 and 10 except that the top ring 32 rotates about its axis at a lower speed. The upper end of the casing 34, the surface plate 37, and the top ring 32 are horizontally surrounded by a reservoir 61 mounted on the upper end of the casing 34 for collecting a polishing solution that is supplied during polishing.

Figure 9:
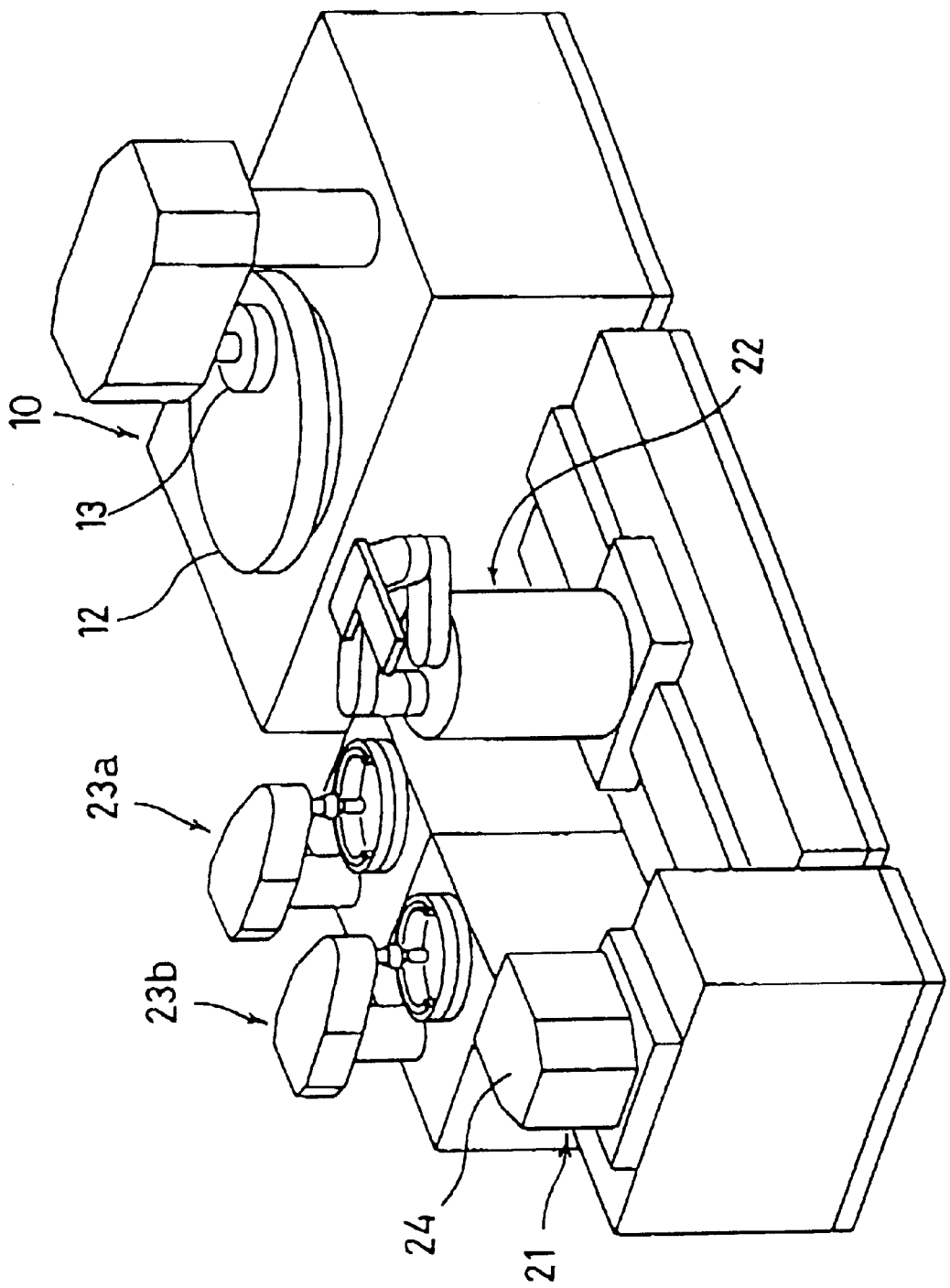
FIG. 9 is a perspective view of a conventional polishing apparatus.

Operation of the polishing apparatus will be described below. A workpiece 1, typically a semiconductor wafer, in a delivery cassette, identical to the delivery cassette 24 shown in FIG. 9, is delivered by the feed robots 22a, 22b through the reversing machine 25, if necessary, to one of the top rings 13 of the main polishing unit 10, and is attached to the top ring 13. The top ring 13 rotates about its own axis and presses the workpiece 1 against the polishing cloth 11 (see FIG. 10) on the turntable 12. A first polishing process is carried out by the actions of the high-speed relative movement between the workpiece 1 and the polishing cloth 11, and of the chemical effects produced by the polishing solution supplied from the polishing solution nozzle 14 (see FIG. 10).

After having completed the first polishing process by the main polishing unit 10, the workpiece 1 is, either directly or after a rough cleaning, transferred to the finish polishing unit 30 where the workpiece 1 is subject to a second polishing process. Specifically, the motor 33 is energized to cause the surface plate 37 to make circulatory translational motion, and the workpiece 1 attached to the top ring 32 is pressed against the upper surface of the polishing cloth 59 that is attached to the surface plate 37. The surface of the polishing cloth 59 constitutes a processing surface.

The workpiece 1 is then polished by a polishing solution that is supplied to the surface to be polished of the workpiece 1 through the supply port 56, the space 55, the discharge ports 57, and the discharge holes 58. The discharge ports 57 and the discharge holes 58 allow the polishing solution to be supplied at a sufficient rate to the entire area of the workpiece 1 including the central area. Since small relative translational motion along circles having the radius "e" occurs between the polishing cloth 59 and the workpiece 1, the workpiece 1 is uniformly polished over its entire surface. If the polished surface of the workpiece 1 and the polishing cloth 59 stay in the same relative positional relationship, then the polished surface of the workpiece 1 would be adversely affected by local irregularities of the polishing cloth 59. To avoid this drawback, the top ring 32 is rotated slowly about its own axis so that the surface of the workpiece 1 is not polished by the same local areas of the polishing cloth 59. Therefore, the surface of the workpiece 1 is polished by successively different areas of the polishing cloth 59, and hence is more uniformly polished.

In the first polishing process carried out by the main polishing unit 10, in order to obtain a given polishing rate, the workpiece 1 and the polishing cloth 11 (see FIG. 10) are moved relatively to each other at a high speed and pressed against each other under relatively large forces. In the second polishing process carried out by the finish polishing unit 30, since minute particles need to be removed from the polished surface of the workpiece 1 while the flatness and surface roughness of the workpiece 1 are also required to be improved, the surface roughness of the polishing cloth 59 is small, and the velocity of relative motion between the workpiece 1 and the polishing cloth 59 and the pressing force of the workpiece 1 against the polishing cloth 59 are smaller than those of the first polishing process. The polishing solution is usually pure water, but may be a chemical or a special slurry if necessary. For example, a chemical or a special slurry depending on the material of the workpiece 1 may be supplied between the workpiece 1 and the polishing cloth 59.

After the second polishing process of the workpiece 1 has been completed by the finish polishing unit 30, the workpiece 1 is cleaned by the cleaning machines 23a–23c in one or more cleaning processes and then dried, and thereafter accommodated in the delivery cassette 24.

In the polishing apparatus, the main polishing unit 10 has two top rings 13. Therefore, if the time required for the second polishing process is reduced to about half the time required for the first polishing process, then the main polishing unit 10 and the finish polishing unit 30 can be operated efficiently without loss of time.

Figure 10:
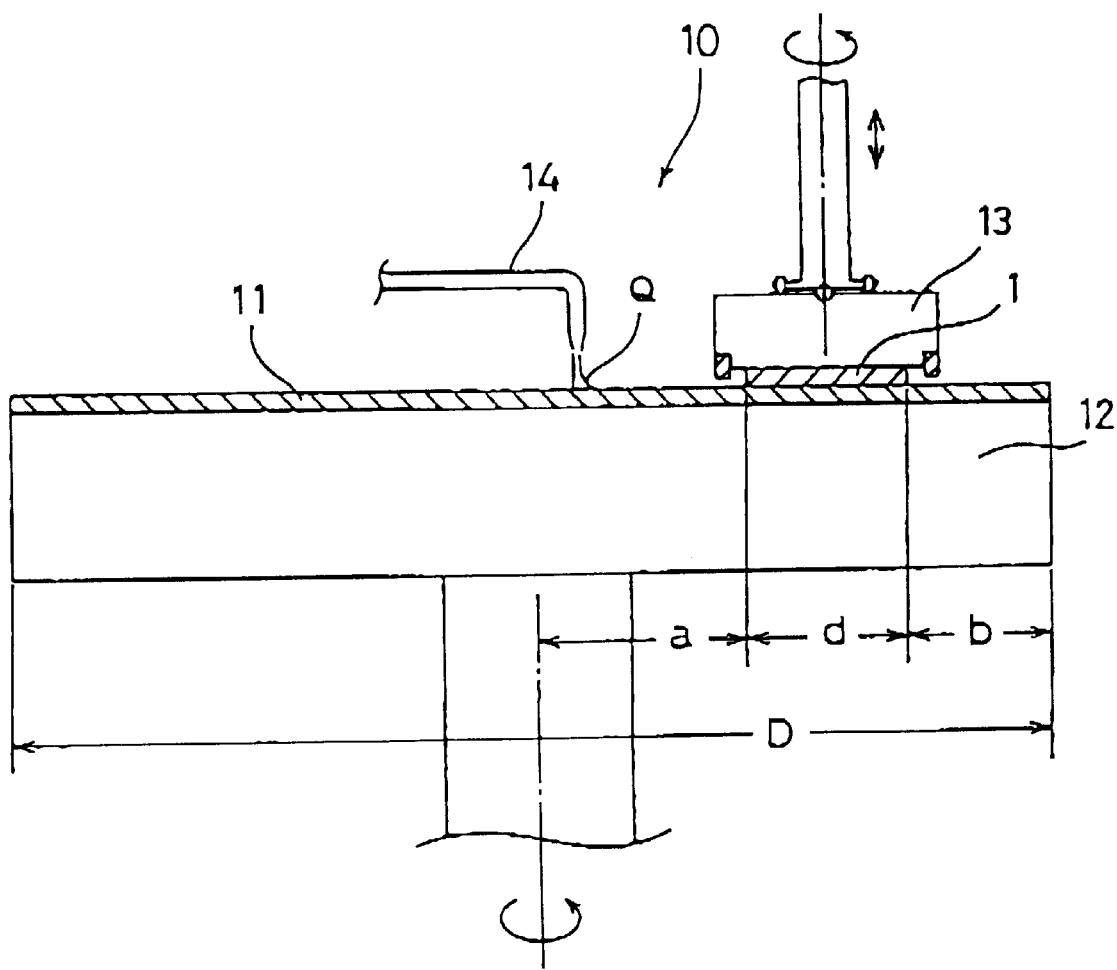
FIG. 10 is a cross-sectional view of a conventional polishing unit of the conventional polishing apparatus shown in FIG. 9.

In this polishing apparatus, since the polishing process is carried out in two stages which are being carried out simultaneously, the time duration in the first polishing step can be reduced, so that the process throughput is increased compared to the rate obtainable with the conventional polishing apparatus shown in FIGS. 9 and 10.

Since the polishing unit 30 is of the circulatory translational motion type, the diameter of the surface plate 37 may be slightly larger than the diameter of the workpiece 1 by the distance "e".

Therefore, compared with a polishing apparatus having two turntables of the same size as the main polishing unit 10, the required floor space is reduced significantly. Further, because the finish polishing unit 30 makes circulatory translational motion, it is possible to support the surface plate 37 at several locations along the peripheral edges of the surface plate 37, as shown in FIG. 2, so that the workpiece can be polished to a higher flatness than with the turntable which rotates at a high speed.

Examples of average conditions for the first polishing process and the second polishing process are given as follows:

1. First Polishing Process
    Polishing solution (Abrasive solution): Differs depending on the material of the workpiece
    Polishing cloth: Differs depending on the material of the workpiece
    Pressure applied to the workpiece: 200–500 g/cm$^2$
    Relative speed: 0.07–0.6 m/sec.
    Polishing time: Differs depending on the amount of material to be removed by polishing
2. Second Polishing Process
    Polishing solution: Water, a chemical, a slurry
    Polishing cloth: Soft cloth (non-woven cloth, nap-like material)
    Pressure applied to the workpiece; 0–200 g/cm$^2$
    Relative speed: 0.07–0.6 m/sec.
    Polishing times 10–120 sec.

While the polishing cloth 59 makes circulatory translational motion in the illustrated embodiment, the workpiece 1 may make circulatory translational motion with respect to the polishing cloth 59. In the illustrated embodiment, the surface plate 37 is supported using the cranked joints 44 combined with the bearings 40, 41. However, the surface plate 37 may be supported by a suitable support structure, such as magnetic bearings or lubrication-free slide bearings, which allow the surface plate 37 to make circulatory translational motion while preventing it from rotating about its own axis.

In the illustrated embodiment, the surface plate 37 is caused to make circulatory translational motion by the eccentric drive shaft 46 on the shaft 45 of the motor 33. However, the surface plate 37 may be moved by a vector sum of motion in an X direction and motion in a Y direction using an X-Y stage, or the polishing cloth 59 and the workpiece 1 may jointly be moved to make circulatory translational motion.

Figure 4:
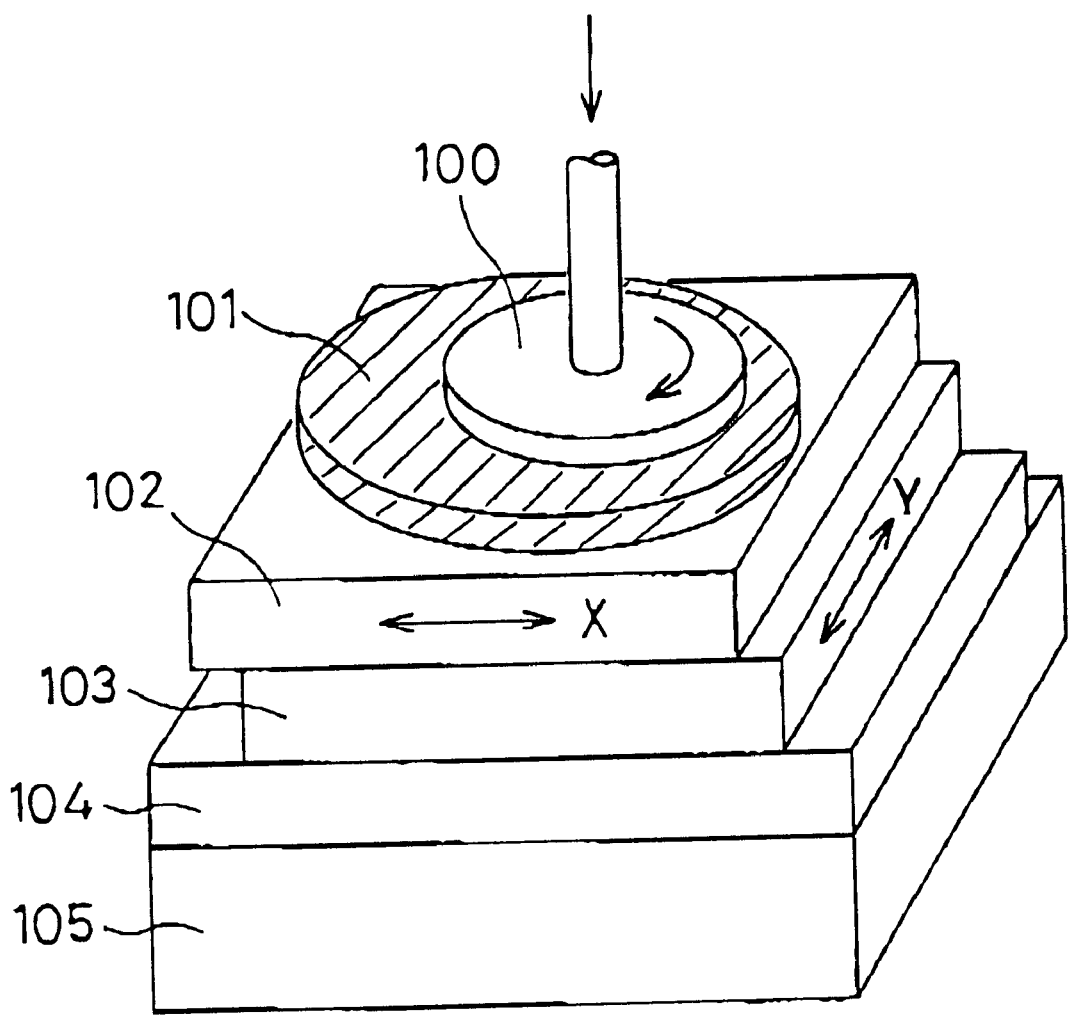
FIG. 4 is a perspective view of a modified embodiment of the finish polishing unit.

FIG. 4 shows an embodiment of a polishing apparatus of this type comprising a top ring 100 for holding a workpiece on the lower surface thereof, and a polishing tool 101 arranged beneath the top ring 100 and attached to the X-Y stage. In this embodiment, an electro-plated grindstone is utilized as a polishing tool of a relatively small abrasive grain size. The X-Y stage comprises an X-stage 102, a Y-stage 103 and a fixing plate 104 which are stacked in the illustrated order and mounted on a base 105. Between the X-stage 102 and the Y-stage 103, there are provided a linear guide mechanism and a linear driving mechanism such as a feed screw so as to make the X-stage 102 movable in the X direction. The same mechanisms are provided between the Y-stage 103 and the fixing plate 104, and a controlling device is provided for controlling these X- and Y- direction driving mechanisms.

In the illustrated embodiment, by applying a displacement having a sine-wave and a cosine-wave of the same phase to the x-stage 102 and the Y-stage 103 respectively, the X-stage 102 will make circulatory translational motion as a vector sum of both directional movements. Thus, the polishing tool 101 makes circulatory translational motion as in the first embodiment of the invention. It is preferable to rotate the top ring 100 with a period of rotation significantly in excess of a period of the circulatory translational motion of the tool 101 in order to eliminate the effect resulting from a local difference of surface condition of the tool.

This embodiment, since a mechanical "eccentric" design is not used, has an advantage that more degrees of freedom in changing the trace (or locus) of the circulatory translational motion can be obtained. For example, since it is possible to change the diameter of the circulatory translational motion without stopping the operation, the polishing motion during the polishing step of the workpiece can be changed so as to polish the workpiece with a smaller diameter in the starting and terminating periods than in the usual polishing period. By applying such a control method, it can avoid the deteriorative effects caused by the localized conditional differences on the polishing tool surface, such as a unidirectional scar, when repeating a simple circulative motion.

The structure of this embodiment can create not only circular translational motion but also any other type of circulatory translational motion such as, an ellipsoidal motion, an eight-shape (8) motion or an oscillating spiral motion, or any kind of combination thereof.

Further, the structure of this embodiment can create not only circulatory motion having a certain trace but also totally random translational motion which is by no means circulatory. This intentional randomization of the relative translational motion can be performed by using a random number generation function of a computer processor, for example. In this case, it is preferable to retain a minimum radius of curvature of the trace in order to keep a smooth motion.

According to the present invention, since the polishing process is carried out in two stages, first and second polishing steps, it is possible to produce a high degree of flatness and smoothness of the workpiece. In the first polishing step, the workpiece and the polishing tool are moved relative to each other at relatively high speeds to produce flat surface of the workpiece. This is followed by a second step to obtain smooth surface of the workpiece by using a polishing tool having a lesser abrasive quality and providing a relatively small degree of relative motion between the workpiece and the polishing tool. The polishing process is completed by removing micro-particles which may adhere to the workpiece, to thus produce a workpiece having a high degree of flatness, smoothness and cleanliness.

According to the present invention, since the second polishing unit of the present invention makes circulatory translational motion, the size of the apparatus can be slightly larger than the workpiece by the distance of eccentricity, thus enabling the apparatus to be compact. Additional benefit is that the drive motor can be small and the occupied floor space is also small. The surface plate is supported at three locations or more around the periphery of the surface plate so that the application of the pressing force does not affect the stability of supporting member and the flatness of the polished surface can be maintained.

Next, a polishing apparatus according to a second embodiment of the present invention will be described with reference to FIGS. 5 and 6.

As shown in FIG. 5, a polishing apparatus has a loading/unloading unit 21 positioned at an end of an elongate rectangular space for loading and unloading workpieces 1 (see FIG. 6) such as semiconductor wafers, and a main polishing unit 10 positioned at an opposite end of the elongate rectangular space for polishing the workpieces 1. The loading/unloading unit 21 and the main polishing unit 10 are interconnected by a workpiece delivery line along which two feed robots 22a, 22b are movable between the loading/unloading unit 21 and the main polishing unit 10. The polishing apparatus also includes a reversing machine 25 disposed on one side of the workpiece delivery line for reversing the workpieces 1, a cleaning unit 130 and three cleaning units 23a, 23b, 23c disposed on the other side of the workpiece delivery line. The cleaning units 23a, 23b, and 23c include rinsing machines or scrubbing machines using brushes, sponges, or the like.

The main polishing unit 10 comprises a turntable 12 and two top rings 13, and is capable of parallel processing of two workpieces simultaneously. Except for the two top rings 13, the main polishing unit 10 is basically the same as the polishing unit 10 shown in FIGS. 9 and 10.

Figure 6:
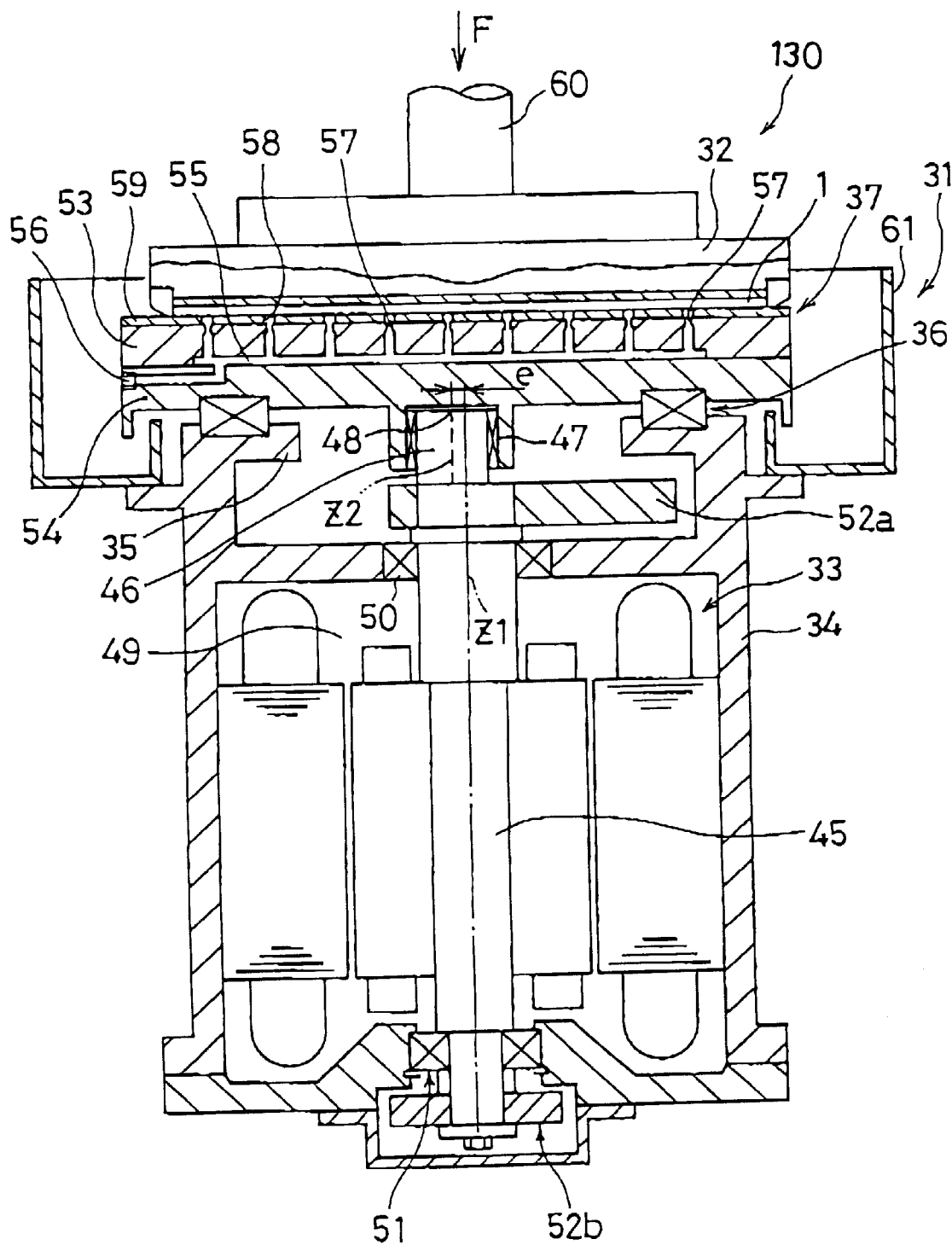
FIG. 6 is a vertical cross-sectional view of a cleaning unit of the polishing apparatus shown in FIG. 5.

As shown in FIG. 6, the cleaning unit 130 has the same structure as the polishing unit 30 of the first embodiment shown in FIG. 2.

Specifically, the cleaning unit 130 comprises a translational table section 31 which provides an abrading surface that makes circulatory translational motion, and a top ring 32 for holding a workpiece 1 with its lower surface facing downwardly and pressing the workpiece 1 against the abrading surface with a given pressure.

Since the translational table section 31 has the same structure as that of the first embodiment shown in FIG. 2, the detailed structure will not be described.

In the second embodiment, a cleaning solution is supplied to the surface to be cleaned of the workpiece through the supply port 56, the space 55, the discharge ports 57, and the discharge holes 58.

Operation of the polishing apparatus shown in FIGS. 5 and 6 will be described below.

A workpiece 1, typically a semiconductor wafer, in a delivery cassette, identical to the delivery cassette 24 shown in FIG. 9, is delivered by the feed robots 22a, 22b through the reversing machine 25, if necessary, to one of the top rings 13 of the main polishing unit 10, and is attached to the top ring 13. The top ring 13 rotates about its own axis and presses the workpiece 1 against the polishing cloth 11 (see FIG. 10) on the turntable 12. The workpiece 1 is polished by the polishing solution Q supplied from the polishing solution nozzle 14 while the workpiece 1 and the polishing cloth 11 are moving relatively to each other at a high speed.

After having been polished by the main polishing unit 10, the workpiece 1 is, either directly or after a rough cleaning, transferred to the cleaning unit 130 where the workpiece 1 is cleaned. Specifically, the motor 33 is energized to cause the surface plate 37 to make circulatory translational motion, and the workpiece 1 attached to the top ring 32 is pressed against the upper surface of the polishing cloth 59 that is attached to the surface plate 37.

The workpiece 1 is then cleaned by a cleaning solution that is supplied to the surface of the workpiece 1 through the supply port 56, the space 55, the discharge ports 57, and the discharge holes 58. The discharge ports 57 and the discharge holes 58 allow the cleaning solution to be supplied at a sufficient rate to the entire area of the workpiece 1 including the central area. Since small relative translational motion along circles having the radius "e" occurs between the polishing cloth 59 and the workpiece 1, the workpiece 1 is uniformly polished over its entire surface. If the polished surface of the workpiece 1 and the polishing cloth 59 stay in the same relative positional relationship, then the polished surface of the workpiece 1 would be adversely affected by local irregularities of the polishing cloth 59. To avoid this drawback, the top ring 32 is rotated slowly about its own axis so that the surface of the workpiece 1 will not be polished only by local areas of the polishing cloth 59. Therefore, the surface of the workpiece 1 is polished by successively different areas of the polishing cloth 59, and hence is more uniformly polished.

In the polishing process carried out by the main polishing unit 10, since the workpiece 1 needs to be polished to a desired surface finish or to be polished in a desired polishing speed, the workpiece 1 and the polishing cloth 59 are moved relatively to each other at a high speed and pressed against each other under relatively large forces for thereby polishing the workpiece 1 to a flat finish, or for thereby polishing the workpiece 1 in a high polishing speed. In the cleaning process carried out by the cleaning unit 130, since minute particles need to be removed from the polished surface of the workpiece 1 while the flatness and surface roughness of the workpiece 1 are also required to be improved, the surface roughness of the polishing cloth 59 is small, and the velocity of relative motion between the workpiece 1 and the polishing cloth 59 and the pressing force of the workpiece 1 against the polishing cloth 59 are smaller than with the polishing process. The cleaning solution is usually pure water, but may be a chemical or a special slurry if necessary. For example, a chemical or a special slurry depending on the material of the workpiece 1 may be supplied between the workpiece 1 and the polishing cloth 59. In the polishing process, the polishing solution contains abrasive particles. In the cleaning process, the cleaning solution usually does not contain abrasive particles, but may contain fine abrasive particles.

After the workpiece 1 has been cleaned by the cleaning unit 130, the workpiece 1 is further cleaned by the cleaning machines 23a–23c in one or more cleaning processes and then dried, and thereafter accommodated in the delivery cassette 24.

In the polishing apparatus, the main polishing unit 10 has two top rings 13. Therefore, if the time required for the cleaning process is reduced to about half the time required for the polishing process, then the main polishing unit 10 and the cleaning unit 130 can be operated efficiently without loss of time.

Consequently, there is the advantage that the overall throughput of the polishing apparatus is much higher than the conventional polishing apparatus shown in FIGS. 9 and 10.

Since the cleaning unit 130 is of the circulatory translational motion type, the diameter of the surface plate 37 may be slightly larger than the diameter of the workpiece 1 by the distance "e". Therefore, the motor 33 may be of a relatively small size, and the polishing apparatus may take up a relatively small space. These advantages manifest themselves when the workpiece 1 such as a semiconductor wafer is larger in size.

Inasmuch as the polishing cloth 59 in the cleaning unit 130 does not rotate about its own axis, the relative speed between the workpiece 1 and the polishing cloth 59 remains in the same condition at any position on the workpiece 1. Therefore, the workpiece 1 can be processed to a flat finish even when it is processed at a low speed, and can advantageously be processed to a smooth surface finish. An installation space for the cleaning unit 130 may be comparatively small. Because the surface plate 37 of the cleaning unit 130 makes circulatory translational motion, the surface plate 37 can be supported at a plurality of positions along its circumferential edge, as shown in FIG. 6. Therefore, even when the surface plate 37 is subjected to large pressing forces, the surface plate 37 can stably be supported, thus allowing the workpiece 1 to be polished to a higher planar finish than with a turntable which rotates at a high speed.

Examples of average conditions for the polishing and cleaning processes are given as follows:

1. Polishing Process
   Polishing solution: Differs depending on the material of the workpiece
   Polishing cloth: Differs depending on the material of the workpiece
   Pressure applied to the workpiece: 200–500 g/cm$^2$
   Relative speed: 0.07–0.6 m/sec.
   Polishing time: Differs depending on the amount of material to be removed by polishing
2. Cleaning Process
   Cleaning solution: Water, a chemical, a slurry
   Polishing cloth: Soft cloth (non-woven cloth, nap-like material)
   Pressure applied to the workpiece: 0–200 g/cm$^2$
   Relative speed: 0.07–0.6 m/sec.
   Cleaning time: 10–120 sec.

While the polishing cloth 59 makes circulatory translational motion in the illustrated embodiment, the workpiece 1 may make circulatory translational motion with respect to the polishing cloth 59. In the illustrated embodiment, the surface plate 37 is caused to make circulatory translational motion by the eccentric drive shaft 46 on the shaft 45 of the motor 33. However, the surface plate 37 may be moved by a vector sum of motion in an X direction and motion in a Y direction using an X-Y stage, or the polishing cloth 59 and the workpiece 1 may jointly be moved to make circulatory translational motion. In the illustrated embodiment, the surface plate 37 is supported using the cranked joints 44 combined with the bearings 40, 41. However, the surface plate 37 may be supported by a suitable support structure, such as magnetic bearings or lubrication-free slide bearings, which allows the surface plate 37 to make circulatory translational motion while preventing it from rotating about its own axis.

Various changes and modifications may be made in the present invention insofar as they have a polishing unit including a first abrasive member rotatable about its own axis for polishing a workpiece while the workpiece is being pressed against the first abrasive member under a predetermined pressure, and a cleaning unit including a second abrasive member made of a wiping cloth, a non-woven cloth, or a cloth other than a non-woven cloth for scrubbing the workpiece while being pressed against the polished surface of the workpiece. For example, the polishing unit 10 with the two top rings 13 as shown in FIG. 5 may be replaced with the polishing unit 10 with the single top ring 13 as shown in FIG. 10, and the cleaning unit 130 with the surface plate 37 making circulatory translational motion may be replaced with a cleaning unit with the turntable 12 and the single top ring 13 as shown in FIG. 10. In such a modification, the polishing solution is used in the polishing unit, whereas the cleaning solution such as water, a chemical or a slurry is used in the cleaning unit, and the relative speed between the workpiece and the abrasive member, the pressure under which the workpiece and the abrasive member are pressed against each other, and the surface roughness of the abrasive member are set to different values in the polishing and cleaning units.

The second abrasive member in the cleaning unit may comprise a polishing cloth, a wiping cloth, or the like. The polishing cloth is generally used to polish semiconductor wafers to a flat mirror finish, and is available on the market. For example, the polishing cloth may be a non-woven cloth of polyester, Suba 800 or IC-1000 manufactured by Rodel, Inc., Surfin xxx-5, Surfin 000 manufactured by Fujimi Incorporated. The polishing cloths, Suba 800, Surfin xxx-5, and Surfin 000 are made of fibers and put together by an urethane resin, and the polishing cloth IC-1000 is made of foamed polyurethane. The foamed polyurethane is porous and has a number of minute recesses on its surface which are considered to be capable of holding particles.

The polishing cloth is basically used to polish semiconductor wafers and is of such a structure as to attract abrasive particles contained in a polishing solution to its own surface. When the polishing cloth is used for cleaning semiconductor wafers, the polishing cloth is effective to easily remove particles that strongly adheres to the semiconductor wafers.

Because the cleaning unit uses a polishing cloth that is originally used to polish a semiconductor wafer, the polishing cloth can reduce the surface roughness of the semiconductor wafer, and hence makes the surface of the semiconductor wafer flat and smooth when the cleaning unit cleans the semiconductor wafer. This effect of the polishing cloth was confirmed by way of experimentation.

The wiping cloth is made of ultrafine fibers having a diameter ranging from 1 to 2 $\mu$m, and is commercially available as Miracle series (tradename) of Toray, Minimax (tradename) of Kanebo, etc. Since these wiping cloths have 100–200 thousand fibers per one square inch, they have many points of contact with a workpiece to be wiped for thereby removing minute particles from the workpiece.

Since the wiping cloth is a thin cloth, it may be attached to the surface plate through a damper of sponge, rubber, or the like so as not to damage the workpiece 1 while cleaning the workpiece 1.

The principles of the present invention are applicable to various workpieces including a glass substrate and a liquid crystal panel which need to be highly cleaned.

The polishing apparatus shown in FIG. 5 may further be modified such that the cleaning units 23a, 23b, 23c such as rinsing machines or scrubbing machines may be positioned adjacent to the polishing unit 10 for removing relatively large particles from the workpiece, and the cleaning unit 130 may be positioned adjacent to the cleaning units 23a, 23b, 23c for removing submicron particles that cannot be removed from the workpiece by a scrubbing action using a brush or a sponge.

Next, a polishing apparatus according to a third embodiment of the present invention will be described with reference to FIGS. 7 and 8.

Figure 7:
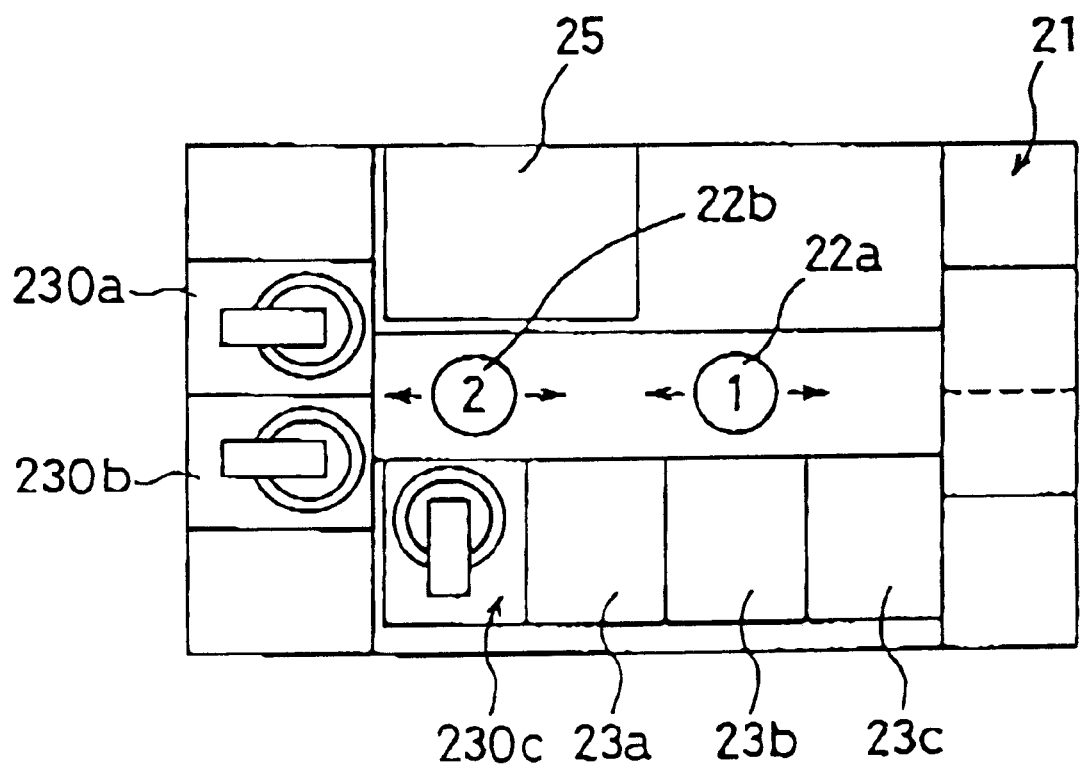
FIG. 7 is a plan view of a polishing apparatus according to a third embodiment of the polishing apparatus.

As shown in FIG. 7, a polishing apparatus has a loading/unloading unit 21 positioned at an end of an elongate rectangular space for loading and unloading workpieces 1 (see FIG. 8) such as semiconductor wafers, and two main polishing units 230a, 230b positioned at an opposite end of the elongate rectangular space for polishing the workpieces 1. The loading/unloading unit 21 and the main polishing units 230a, 230b are interconnected by a workpiece delivery line along which two feed robots 22a, 22b are movable between the loading/unloading unit 21 and the main polishing units 230a, 230b. The polishing apparatus also includes a reversing machine 25 disposed on one side of the workpiece delivery line for reversing the workpieces 1, a finish polishing unit 230c and three cleaning units 23a, 23b, 23c disposed on the other side of the workpiece delivery line. The cleaning units 23a, 23b, 23c include rinsing machines or scrubbing machines using brushes, sponges, or the like.

The main polishing units 230a, 230b and the finish polishing unit 230c are basically of the same structure, and are respectively provided with a translational table section 31 which provides circulatory translational motion of the abrading surface of a polishing tool, and a top ring 32 for holding the workpiece 1 to be polished and pressing the workpiece 1 against the abrading surface with a given pressure.

The main and finish polishing units 230a, 230b and 230c have the same structure as the finish polishing unit 30 of the first embodiment shown in FIG. 2, except for an abrading plate.

To be more specific, an abrading plate 159 is attached to the top surface of the surface plate 37 of the main polishing units 230a, 230b, and a polishing cloth 159a is attached to the surface plate 37 of the finish polishing unit 230c. The abrading plate 159 and polishing cloth 159a are also provided with a plurality of discharge holes 58 aligned in registry with the respective discharge ports 57. The discharge ports and holes 57, 58 are disposed substantially uniformly over the entire surface of the surface plate 37, the abrading plate 159 and the polishing cloth 159a. The abrading plate 159 is bonded to the top surface of the surface plate 37 in the main polishing units 230a, 230b, and the polishing cloth 159a is bonded to the top surface of the surface plate 37 in the finish polishing unit 230c.

The abrading plate 159 is a circular disc made of abrasive grains of less than several micrometers (for example, $CeO_2$) and a resin serving as a binder for the abrasive grains. In order to make the abrading surface flat, the material and manufacturing process are selected so that the abrading plate 159 would not have bowing and deformation during manufacturing and storage. The abrading plate 159 has a grid-like, spiral, or radial pattern of grooves defined in the upper surface to distribute the polishing solution and to remove ground-off particles by polishing, and the discharge holes 58 are aligned with the grooves. The particle size of the abrasive grains contained in the polishing solution is selected so that the particle size of the abrasive grains is relatively large for the rough polishing units 230a, 230b, but is relatively small in the finish polishing unit 230c.

The top ring 32 has the same structure as the top ring of the first embodiment shown in FIG. 2.

Operation of the polishing apparatus in the third embodiment will be described below.

A workpiece 1, typically a semiconductor wafer, in a delivery cassette, identical to the delivery cassette 24 shown in FIG. 9, is delivered by the feed robots 22a, 22b through the reversing machine 25, if necessary, to one of the top rings 13 of the main polishing units 230a, 230b, and is attached to the top ring 13. In the main polishing units 230a or 230b, rough polishing is performed. Roughly polished workpiece is transferred by the robot 22a, 22b to the cleaning machine 23a and cleaned therein, and then finish polishing is performed in the finish polishing unit 230c.

Details of the polishing action will be explained further. The surface plate 37 makes circulatory translational motion by the action of the driving motor 33, and the workpiece 1 attached to the top ring 32 is pressed against the surface of the abrading plate 159 bonded to the surface plate 37. The polishing solution is supplied to the surface to be polished of the workpiece 1 through the supply port 56, the space 55, the discharge ports and holes 57, 58, and the grooves of the abrading plate 159.

The action of the minute circular translational motion (of motion radius "e") between the workpiece 1 and the rubbing surface of the abrading plate 159 produces a uniform polish on the entire surface of the workpiece 1.

If the polished surface of the workpiece 1 and the abrading plate 159 stay in the same relative positional relationship, then the polished surface of the workpiece 1 would be adversely affected by local irregularities of the abrading plate 159. To avoid this drawback, the top ring 32 is rotated slowly about its own axis so that the surface of the workpiece 1 is not polished by the same local areas of the abrading plate 159. Therefore, the surface of the workpiece 1 is polished by successively different areas of the abrading plate 159, and hence is more uniformly polished.

Finish polishing is basically the same process as rough polishing. Here, in the main polishing process, polishing conditions are such that the workpiece 1 and the polishing tool (abrading plate) 159 are moved at a relatively fast speed, and that the pressing force is relatively high and the polishing solution contains relatively coarse abrasive grains to produce a given amount of material removal. On the other hand, the purpose of the finish polishing process is, in addition to producing further leveling and smoothing of the surface of the workpiece, to remove any adhered microparticles from the surface of the workpiece. Therefore, roughness of the polishing surface of the polishing tool (cloth) 159a is finer, and the velocity of relative motion and pressing force between the polishing tool and the workpiece are lower than those in the main polishing process. The polishing solution is usually deionized water, but occasionally a chemical or a slurry may be used when necessary. In case of using a slurry, the use of abrasive grains of the same material as the abrading plate in the slurry may produce good polishing results.

After the finish polishing process of the workpiece 1 has been completed by the finish polishing units 230c, the workpiece 1 is cleaned by the cleaning machines 23a–23c in one or more cleaning processes and then dried, and thereafter accommodated in the delivery cassette 24.

In this polishing apparatus, two main polishing units 230a, 230b are provided to perform the main polishing process while one finish polishing unit 230c is provided. This is because the duration of the main polishing process is longer than that of the finish polishing process. Thus, the main polishing units and the finish polishing unit can be operated efficiently without a loss time.

In the polishing apparatus, because the polishing process is carried out in two stages in parallel, particle size of the abrading plate 159 and the supply and discharge ports 57, 58 can be selected to suit the condition of each polishing process. Therefore, the duration of each polishing process is shortened. Accordingly, the throughput in the overall apparatus is significantly improved compared with the conventional polishing apparatus shown in FIGS. 9 and 10.

Since the polishing units 230a–230c are of the circulatory translational motion type, the diameter of the surface plate 37 may be slightly larger than the diameter of the workpiece 1 by the distance "e". Therefore, compared with the conventional polishing unit 10, the installation space is reduced significantly. Additionally, it is easier to design a combined layout of units including cleaning machines and inverters as well as to modify an existing layout.

Figure 8:
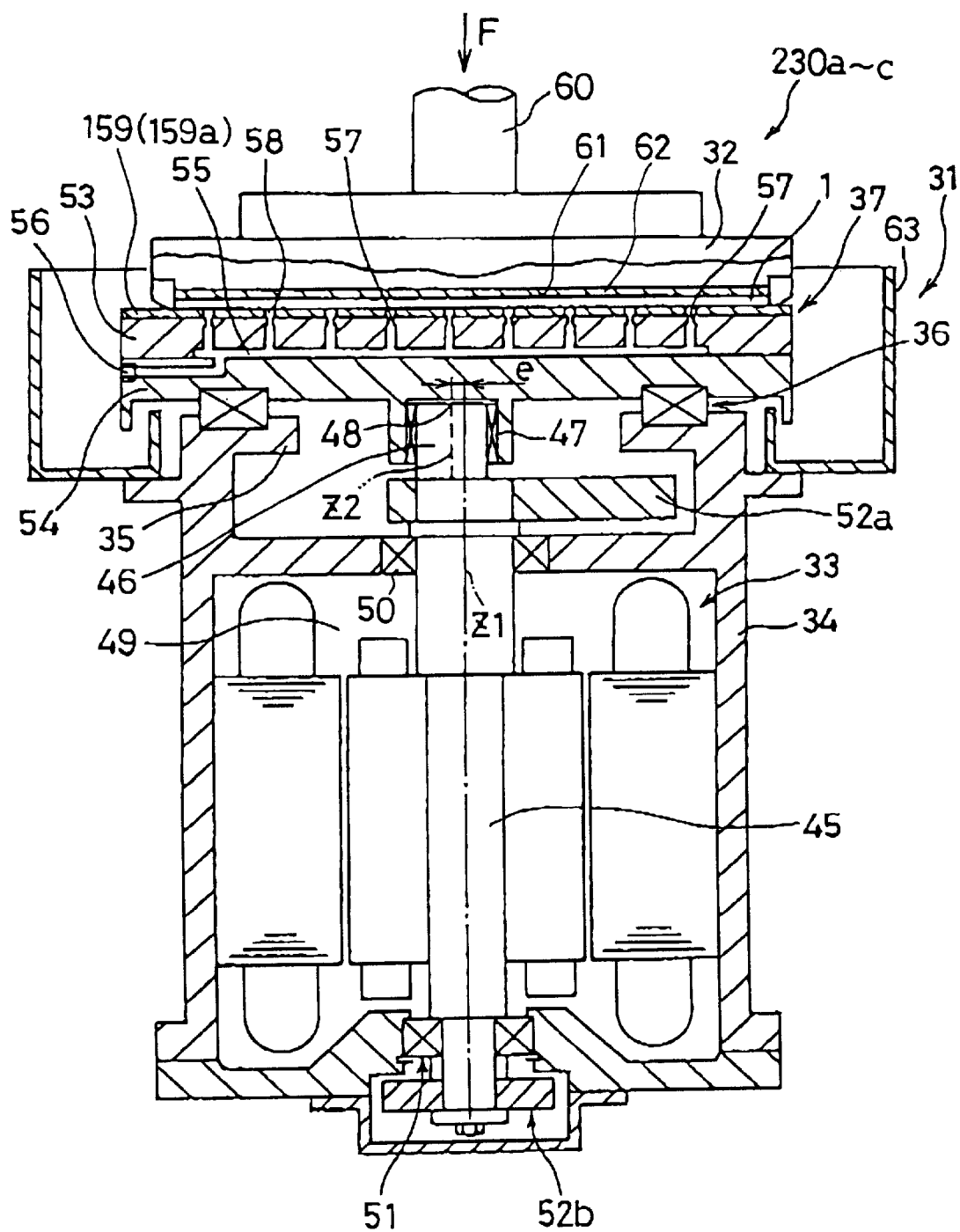
FIG. 8 is a vertical cross-sectional view of a polishing unit of the polishing apparatus shown in FIG. 7.

Furthermore, because the surface plate 37 makes circulatory translational motion in the polishing units 230a–230c, the surface plate 37 is supported at several locations along the peripheral edge of the surface plate 37 as shown in FIG. 8, so that the workpiece can be polished to a higher flatness than with the conventional polishing apparatus having a turntable which rotates at a high speed.

Although the polishing cloth is used in the second polishing process in the illustrated embodiment, an abrading plate may also be used in the second polishing process. In this case, abrasive grains of the abrading plate in the second polishing process are finer than those in the first polishing process.

Examples of average conditions for the first polishing process and the second polishing process are given as follows:

1. First Polishing Process
   Polishing solution (Abrasive solution): Differs depending on the material of the workpiece
   Material of abrasive grains of the abrading plate; $CeO_2$
   Grain size of the abrading plate: 0.1–10 $\mu$m
   Pressure applied to the workpiece: 200–500 g/cm$^2$
   Relative speed: 0.07–0.6 m/sec.
   Polishing time: Differs depending on the amount of material to be removed by polishing
2. Second Polishing Process
   Polishing solution: Water, a chemical, a slurry
   Polishing cloth: Soft cloth (non-woven cloth, nap-like material)
   Pressure applied to the workpiece: 0–200 g/cm$^2$
   Relative speed; 0.07–0.6 m/sec
   Polishing time; 10–120 sec.

In the above embodiment, although the polishing tool makes circulative translation motion, the workpiece may make the same motion. In the illustrated embodiment, the surface plate 37 is caused to make circulatory translational motion by the eccentric drive shaft 46 on the shaft 45 of the motor 33. However, the surface plate 37 may be moved by a vector sum of motion in an X direction and motion in a Y direction using an X-Y stage. Also, the circular translation motion is produced by an "eccentric" design provided at the end of the drive shaft of the motor, but other designs may be utilized. For example, circulative translation motion of the surface plate may be created by the vector sum of motions in the X- and Y-directions using the X-Y stage. Further, the polishing tool and the substrate may jointly be moved to make circulatory translational motion. Also, a crank type of support is utilized to support the surface plate, but it is possible to use other types of support such as magnetic bearings or lubrication-free slide bearings, which allow the surface plate 37 to make circulatory translational motion while preventing it from rotating about its own axis.

According to the third embodiment of the present invention, because the size of the abrading plate needs to be slightly larger than the workpiece size, it is easy to produce higher flatness over the entire surface of the polishing tool, compared with the conventional large polishing table. The polishing apparatus becomes compact and the drives can also be small, and the installation space of the polishing apparatus is minimized. The overall design of the polishing apparatus, including the cleaning and reversing machines, is simplified, and the changes of the layout can be made readily. These advantages become more important as the size of the workpiece to be processed increases. Because the polishing tool is not rotated, the relative speed between the workpiece and the polishing tool is uniform over the entire surface of the workpiece, and hence it is possible to produce flatness of the workpiece even at a low speed and to provide a smooth surface of a superior quality.

Although a certain preferred embodiment of the present invention has been shown and described in detail, it should be understood that various changes and modifications may be made therein without departing from the scope of the appended claims.

What is claimed is:

1. A method for polishing a surface of a workpiece, comprising:
   providing a polishing surface for polishing the surface of the workpiece by relative movement of the workpiece and the polishing surface; and providing a processing surface for processing the surface of the workpiece by relative movement of the workpiece and the processing surface, the processing surface undergoing translational motion that is different from the relative movement of the workpiece and the polishing surface, wherein the polishing surface and the processing surface are discrete from each other, and the workpiece is processed by both of the polishing surface and the processing surface.

2. A method according to claim 1, wherein said polishing surface comprises a surface of a polishing cloth.

3. A method according to claim 1, wherein said polishing surface rotates about its rotating axis.

4. A method according to claim 1, wherein said relative translational motion of said polishing surface is provided only by moving said polishing surface.

5. A method according to claim 1, wherein said processing comprises polishing of the polished surface of the workpiece.

6. A method according to claim 1, wherein said processing comprises cleaning of the polished surface of the workpiece.

7. A method according to claim 1, wherein said processing surface comprises a surface of a polishing cloth.

8. A method according to claim 1, wherein said processing surface comprises a surface of a wiping cloth.

9. A method according to claim 1, wherein said relative translational motion of said processing surface is provided only by moving said processing surface.

10. A method according to claim 1, wherein said processing comprises the translational motion being non-rotational motion.

11. A method according to claim 1, wherein said processing comprises the translational motion causing every point on the processing surface to describe a substantially identical locus with respect to the workpiece.

12. A method according to claim 1, wherein said processing comprises the translational motion being circulatory translational motion.

13. A method according to claim 1, wherein the workpiece is held by a top ring and rotated about an axis of said top ring during said processing.

14. A method according to claim 1, wherein velocity of relative motion between the workpiece and said processing surface in said processing is smaller than velocity of relative motion between the workpiece and the polishing surface in said polishing.

15. A method according to claim 1, wherein a pressing force of the workpiece against the processing surface during said processing is smaller than a pressing force of the workpiece against the polishing surface during said polishing.

16. A method according to claim 1, wherein said processing surface comprises abrasive grains and a binder binding the abrasive grains.

17. A method according to claim 1, wherein said polishing surface comprises abrasive grains and a binder binding the abrasive grains.

18. An apparatus for polishing a surface of a workpiece, comprising:
a polishing surface for polishing the surface of the workpiece by relative movement of the workpiece and said polishing surface; and
a processing surface arranged to undergo translational motion that is different from the relative movement of the workpiece and the polishing surface, said processing surface being discrete from said polishing surface, for processing the surface of the workpiece by pressing the workpiece against said processing surface while said processing surface undergoes the translational motion, wherein the workpiece is processed by both of said polishing surface and said processing surface.

19. An apparatus according to claim 18, wherein said polishing surface comprises a surface of a polishing cloth.

20. An apparatus according to claim 18, wherein said polishing surface rotates about its rotating axis.

21. An apparatus according to claim 18, wherein said relative translational motion of said polishing surface is provided only by moving said polishing surface.

22. An apparatus according to claim 18, wherein the workpiece is polished by said processing surface.

23. An apparatus according to claim 18, wherein the workpiece is cleaned by said processing surface.

24. An apparatus according to claim 18, wherein said processing surface comprises a surface of a polishing cloth.

25. An apparatus according to claim 18, wherein said processing surface comprises a surface of a wiping cloth.

26. An apparatus according to claim 18, wherein said relative translational motion of said processing surface is provided only by moving said processing surface.

27. An apparatus according to claim 18, wherein the translational motion is non-rotational motion.

28. An apparatus according to claim 18, wherein the translational motion causes every point on the processing surface to describe a substantially identical locus with respect to the workpiece.

29. An apparatus according to claim 18, wherein the translational motion is a circulatory translational motion.

30. An apparatus according to claim 18, and including a top ring for holding the workpiece and rotating the workpiece about an axis of said top ring.

31. An apparatus according to claim 18, wherein said processing unit has a velocity of relative motion between the workpiece and said processing surface that is smaller than the velocity of relative motion between the workpiece and said polishing surface.

32. An apparatus according to claim 18, said processing unit has a pressing force of the workpiece against said processing surface that is smaller than the pressing force of the workpiece against said polishing surface.

33. An apparatus according to claim 18, wherein said polishing unit has said polishing surface thereof arranged to rotate about an axis of said polishing surface.

34. An apparatus according to claim 18, wherein said processing surface comprises abrasive grains and a binder binding the abrasive grains.

35. An apparatus according to claim 18, wherein said polishing surface comprises abrasive grains and a binder binding the abrasive grains.

36. A method for polishing a surface of a workpiece, comprising:
providing a polishing surface for polishing the surface of the workpiece by relative movement of the workpiece and the polishing surface; and
providing a processing surface for processing the surface of the workpiece by relative movement of the workpiece and the processing surface, the processing surface undergoing non-rotational motion that is different from the relative movement of the workpiece and the polishing surface, wherein the polishing surface and the processing surface are discrete from each other, and the workpiece is processed by both of the polishing surface and the processing surface.

37. A method according to claim 36, wherein said polishing surface comprises a surface of a polishing cloth.

38. A method according to claim 36, wherein said polishing surface comprises a surface of an abrading plate.

39. A method according to claim 36, wherein said polishing surface rotates about its rotating axis.

40. A method according to claim 36, wherein said polishing surface makes relative translational motion relative to the workpiece.

41. A method according to claim 36, wherein said processing comprises polishing of the polished surface of the workpiece.

42. A method according to claim 36, wherein said processing comprises cleaning of the polished surface of the workpiece.

43. A method according to claim 36, wherein said processing surface comprises a surface of a polishing cloth.

44. A method according to claim 36, wherein said processing surface comprises a surface of a wiping cloth.

45. A method according to claim 36, wherein said processing surface comprises a surface of an abrading plate.

46. A method according to claim 36, wherein the workpiece is held by a top ring and rotated about an axis of said top ring during said processing.

47. A method according to claim 36, wherein velocity of relative motion between the workpiece and said processing surface in said processing is smaller than velocity of relative motion between the workpiece and the polishing surface in said polishing.

48. A method according to claim 36, wherein a pressing force of the workpiece against the processing surface during said processing is smaller than a pressing force of the workpiece against the polishing surface during said polishing.

49. A method according to claim 36, wherein said non-rotational motion is translational motion.

50. A method according to claim 36, wherein said processing surface comprises abrasive grains and a binder i binding the abrasive grains.

51. A method according to claim 36, wherein said polishing surface comprises abrasive grains and a binder binding the abrasive grains.

52. An apparatus for polishing a surface of a workpiece, comprising:
a polishing surface for polishing the surface of the workpiece by relative movement of the workpiece and said polishing surface; and
a processing surface discrete from said polishing surface, said processing surface arranged to undergo non-rotational motion that is different from the relative movement of the workpiece and the polishing surface so that the surface of the workpiece can be processed by pressing the workpiece against said processing surface while said processing surface undergoes the non-rotational motion, wherein the workpiece is processed by both of said polishing surface and said processing surface.

53. An apparatus according to claim 52, wherein said polishing surface comprises a surface of a polishing cloth.

54. An apparatus according to claim 52, wherein said polishing surface comprises a surface of an abrading plate.

55. An apparatus according to claim 52, wherein said polishing surface rotates about its rotating axis.

56. An apparatus according to claim 52, wherein said polishing surface makes relative translational motion relative to the workpiece.

57. An apparatus according to claim 52, wherein said processing comprises polishing of the polished surface of the workpiece.

58. An apparatus according to claim 52, wherein said processing comprises cleaning of the polished surface of the workpiece.

59. An apparatus according to claim 52, wherein said processing surface comprises a surface of a polishing cloth.

60. An apparatus according to claim 52, wherein said processing surface comprises a surface of a wiping cloth.

61. An apparatus according to claim 52, wherein said processing surface comprises a surface of an abrading plate.

62. An apparatus according to claim 52, wherein, the workpiece is held by a top ring and rotated about an axis 5 of said top ring during said processing.

63. An apparatus according, to claim 52, wherein velocity of relative motion between the workpiece and said processing surface in said processing is smaller than velocity of relative motion between the workpiece and the polishing surface in said polishing.

64. An apparatus according to claim 52, wherein a pressing force of the workpiece against the processing surface during said processing is smaller than a pressing force of the workpiece against the polishing surface during said polishing.

65. An apparatus according to claim 52, wherein said non-rotational motion is translational motion.

66. An apparatus according to claim 52, wherein said processing surface comprises abrasive grains and a binder binding the abrasive grains.

67. An apparatus according to claim 52, wherein said processing surface comprises abrasive grains and a binder binding the abrasive grains.

* * * * *